United States Patent
Bessho (10) Patent No.: US 7,200,036 B2
(45) Date of Patent: Apr. 3, 2007

(54) MEMORY INCLUDING A TRANSFER GATE AND A STORAGE ELEMENT

(75) Inventor: Kazuhiro Bessho, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/248,812

(22) Filed: Oct. 11, 2005

(65) Prior Publication Data

US 2006/0114715 A1  Jun. 1, 2006

(30) Foreign Application Priority Data

Nov. 26, 2004 (JP) ............................ P2004-342583

(51) Int. Cl.
*G11C 11/00* (2006.01)
(52) U.S. Cl. ...................... 365/158; 365/173
(58) Field of Classification Search ................ 365/158, 365/173
See application file for complete search history.

(56) References Cited

U.S. PATENT DOCUMENTS 6,714,390 B2 * 3/2004 Terada et al. .......... 360/324.12
6,781,871 B2 * 8/2004 Park et al. ................... 365/158
6,828,785 B2 * 12/2004 Hosomi et al. ............. 324/252

* cited by examiner

*Primary Examiner*—Hoai V. Ho
(74) *Attorney, Agent, or Firm*—Sonnenschein Nath & Rosenthal LLP

(57) ABSTRACT

Each memory cell is composed of a storage layer (2) for storing therein information based on the magnetization state of a magnetic material, a magnetization fixed layer (4) provided on the storage layer (2) through an intermediate layer (3), a storage element (10) for applying an electric current in the laminating layer direction to change the direction of magnetization of the storage layer (2) thereby to record information on the storage layer (2) and a memory cell including a selection transistor, wherein a polarity which requires a large amount of electric current to record information and a polarity by which a large amount of saturation electric current can be supplied to the selection transistor are made coincident with each other. A size of each memory cell including the selection transistor can be decreased to the minimum by suppressing influences of asymmetric property of a write electric current and a memory can integrate the memory cells at a high density.

8 Claims, 7 Drawing Sheets

MEMORY INCLUDING A TRANSFER GATE AND A STORAGE ELEMENT

CROSS REFERENCES TO RELATED APPLICATIONS

The present invention contains subject matter related to Japanese Patent Application JP 2004-342583 filed in the Japanese Patent Office on Nov. 26, 2004, the entire contents of which being incorporated herein by reference.

BACKGROUND OF THE INVENTION

1. Field of the Invention

The present invention relates to a memory composed of a storage layer for storing therein information based on the magnetization state of a ferromagnetic layer, a magnetization fixed layer of which magnetization direction is fixed and a storage element in which the magnetization direction of the storage layer is changed with application of an electric current, and particularly relates to a memory suitable for use as the application to a nonvolatile memory.

2. Description of the Related Art

As information equipment, in particular, personal small information equipment such as personal digital assistants is widespread rapidly, it is requested that devices such as memory and logic constructing personal small information equipment should become higher in performance in such a way as to become higher in integration degree, to become higher in operation speed and to become smaller in power consumption.

In particular, technologies to make semiconductor nonvolatile memories become higher in speed and larger in storage capacity become more important as complementary technologies to a magnetic hard disk which has been so far essentially difficult to be miniaturized, to become higher in speed and to become lower in power consumption due to the presence of movable parts and the like. Also, the above-mentioned technologies to realize the above-mentioned high-speed and large-capacity semiconductor nonvolatile memory become more important in order to realize new functions such as a so-called "instant on" by which an operation system can get started as the same time it is energized.

A semiconductor flash memory and a FeRAM (ferroelectric nonvolatile memory) and the like are now commercially available as the nonvolatile memory, and such nonvolatile memories are now under active research and development in order to make nonvolatile memories become higher in performance.

In recent years, as a new nonvolatile memory using as a magnetic material, a MRAM (magnetic random-access memory) using a tunnel magnetoresistive effect has been developed and advanced so far remarkably and it now receives a remarkable attention (see Cited Non-Patent References 1 and 2, for example).

This MRAM has a structure in which very small magnetic memory devices to record information are located regularly, wirings, for example, word lines and bit lines being provided to access these magnetic memory devices.

Each magnetic memory device includes a storage layer to record information as the magnetization direction of a ferromagnetic material.

Then, as the arrangement of the magnetic memory device, there is employed a structure using a so-called magnetic tunnel junction (MTJ: magnetic tunnel junction) composed of the above-mentioned storage layer, a tunnel insulating layer (non-magnetic spacer film) and a magnetization fixed layer whose magnetization direction is fixed. The magnetization direction of the magnetization fixed layer can be fixed by providing an antiferromagnetic layer, for example.

Since this structure generates a so-called tunnel magnetoresistive effect in which a resistance value relative to a tunnel electric current flowing through the tunnel insulating film changes in response to an angle formed between the magnetization direction of the storage layer and the magnetization direction of the magnetization fixed layer, it is possible to write (record) information by using this tunnel magnetoresistive effect. The magnitude of this resistance value becomes the maximum value when the magnetization direction of the storage layer and the magnetization direction of the magnetization fixed layer are anti-parallel to each other and it becomes the minimum value when they are parallel to each other.

According to the magnetic memory device having the above-mentioned arrangement, information can be written (recorded) on the magnetic memory device by controlling the magnetization direction of the storage layer of the magnetic memory device with application of a synthesized electric current magnetic field generated when an electric current flows through both of the word line and the bit line. It is customary to store a difference between the resultant magnetization directions (magnetized states) of the storage layer in response to "0" information and "1" information.

When on the other hand recorded information is read out from the magnetic memory device, a memory cell is selected by using a device such as a transistor and a difference between the magnetization directions of the storage layer is detected as a difference between voltage signals by using the tunnel magnetoresistive effect of the magnetic memory device, whereby recorded information can be detected.

Having compared this MRAM with other nonvolatile memories, it is to be understood that the maximum merit of the MRAM is that, since "0" information and "1" information are rewritten by inverting the magnetization direction of the storage layer formed of the ferromagnetic material, the MRAM can be rewritten at a high speed nearly infinitely ($>10^{15}$ times).

However, the MRAM has to generate a relatively large electric current magnetic field to rewrite recorded information and hence an electric current of a certain large magnitude (for example, about several milliamperes (mA)) should flow through the address wirings. Therefore, it is unavoidable that power consumption of the MRAM is increased considerably.

Also, the MRAM needs write address wiring and read address wiring and hence it has been difficult to microminiaturize a memory cell from a structure standpoint.

Further, as the device is microminiaturized increasingly, the address wiring also is reduced in width so that it becomes difficult to apply a sufficient electric current to the address wiring. In addition, since coercive force of the device is increased, a necessary electric current magnetic field is increased and hence power consumption of the device is increased.

Accordingly, it has been difficult to microminiaturize the device.

For this reason, a memory having an arrangement to use magnetization inversion generated by spin transfer receives a remarkable attention as an arrangement capable of inverting the magnetization direction with application of a small electric current.

Magnetization inversion generated by spin transfer is to cause magnetization inversion to occur in other magnetic material by injecting spin-polarized electrons from the magnetic material to other magnetic material (see Cited Patent Reference 1, for example).

Specifically, magnetization inversion generated by spin transfer is a phenomenon to give torque to the magnetization of this magnetic layer when spin-polarized electrons passed through the magnetic layer (magnetization fixed layer) of which magnetization direction is fixed enter other magnetic layer (magnetization free layer) whose magnetization direction is not fixed. Then, the magnetization direction of the magnetic layer (magnetization free layer) can be inverted with application of an electric current of a magnitude higher than a certain threshold value.

For example, with application of an electric current to a giant magnetoresistive effect device (GMR device) or a magnetic tunnel junction device (MTJ device) including a magnetization fixed layer and a magnetization free layer in the direction perpendicular to the film plane thereof, the magnetization direction of at least a part of the magnetic layer of these device can be inverted.

Thus, when the storage element including the magnetization fixed layer and the magnetization free layer (storage layer) is constructed and a polarity of an electric current flowing through the storage element is changed, the magnetization direction of the storage layer is inverted to rewrite "0" information and "1" information.

When recorded information is read out from the memory, recorded information can be read out from the memory by using the tunnel magnetoresistive effect similarly to the MRAM because this memory has the arrangement in which the tunnel insulating layer is provided between the magnetization fixed layer and the magnetization free layer (storage layer).

Then, magnetization inversion based on spin transfer has an advantage in that magnetization inversion can be realized without increasing an electric current even when the device is microminiaturized.

An absolute value of an electric current flowing through the storage element to invert the magnetization direction is less than 1 mA in a storage element of the scale of approximately 0.1 μm, for example. In addition, the above-mentioned absolute value is decreased in proportion to a volume of a storage element, which is advantageous from a scaling standpoint.

In addition, since the recording word line, which has been required by the MRAM, becomes unnecessary, this memory has an advantage in that the arrangement of the memory cell can be simplified.

[Cited Non-Patent Reference 1]: NIKKEI ELECTRONICS, 2001, VOL. 2. 12 (pp. 164 to 171)

[Cited Non-Patent Reference 2]: J. NaHas et al., IEEE/ISSCC 2004 Visulas Supplement, p. 22

[Cited Patent Reference 1]: Official Gazette of Japanese laid-open patent application No. 2003-17782

Figure 1:
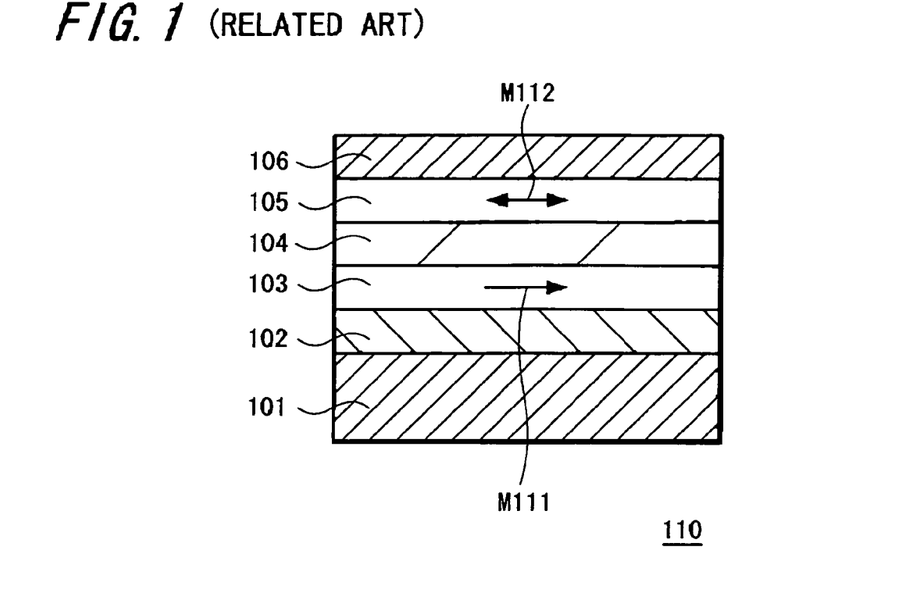
FIG. 1 is a schematic cross-sectional view showing an arrangement of a storage element capable of recording information by using spin transfer.

FIG. 1 of the accompanying drawings is a schematic cross-sectional view showing an arrangement of a storage element capable of recording information by using spin transfer according to the related art.

As shown in FIG. 1, this storage element 110 is composed of an underlayer 101, an antiferromagnetic layer 102, a magnetization fixed layer 103, a non-magnetic layer 104, a storage layer 105 and a capping layer 106 laminated with each other, in that order, from the lower layer.

The storage layer 105 is made of a ferromagnetic material having uniaxial magnetic anisotropy and the storage element 110 is able to store information therein depending on the magnetization state of this storage layer 105, that is, the direction of a magnetization M112 of the storage layer 105.

The magnetization fixed layer 103 made of a ferromagnetic material and of which direction of a magnetization M111 is fixed is provided through the non-magnetic layer 104 to the storage layer 105. In the arrangement shown in FIG. 1, since the antiferromagnetic layer 102 is formed on the lower layer of the magnetization fixed layer 103, the direction of the magnetization M111 of the magnetization fixed layer 103 is fixed by the action of this antiferromagnetic layer 102.

When information is written in this storage element 110, the direction of the magnetization direction M112 of the storage layer 105 is inverted based on spin transfer with application of an electric current flowing through the direction perpendicular to the film plane of the storage layer 105, that is, the lamination layer direction of the storage element 110.

Magnetization inversion based on spin transfer will be described in brief.

Electron has two kinds of spin angular momentums. Let it be assumed hat the two kinds of spin angular momentums are defined as upward spin angular momentum and downward spin angular momentum. Both of the upward spin angular momentums and the downward spin angular momentums are of the same number within the non-magnetic material but they are different in number within the ferromagnetic material.

In the storage element 110 shown in FIG. 1, let it be considered the case in which the directions of the magnetic moments are anti-parallel to each other in the magnetization fixed layer 103 and the storage layer 105 and in which electrons are to be transferred from the magnetization fixed layer 103 to the storage layer 105.

Electrons passed through the magnetization fixed layer 103 are spin-polarized so that the upward spin angular momentum and the downward spin angular momentum are different from each other in number.

If electrons reach the other magnetic material before the thickness of the non-magnetic layer 104 is sufficiently thin so that spin polarization is relaxed and electrons are placed in the non-polarized state (upward spin momentum and downward spin momentum are the same in number) of the ordinary non-magnetic material, then since the directions of the magnetic moments of the magnetization fixed layer 103 and the storage layer 1–5 are anti-parallel to each other and signs of degree of spin polarization are opposite to each other, a part of electrons is inverted, that is, the direction of the spin angular momentum is changed in order to decrease energy of the system. At that time, since a total angular momentum of the system should be preserved, reaction equivalent to the total of angular momentums changed by electrons of which directions are changed is given to the magnetic moment of the storage layer 105.

When there are few electric currents, that is, electrons passed at the unit time, there are a small total number of electrons whose directions are to be changed so that the change of the angular momentum generated in the magnetic moment of the storage layer 105 is small. However, when an electric current is increased, many changes of the angular momentums can be given to the electrons within the unit time. The time change of the angular momentum is torque. When torque exceeds a threshold value, the magnetic moment M112 of the storage layer 105 starts to be inverted and it is stabilized after it was rotated 180 degrees owing to its uniaxial magnetic anisotropy. That is, the magnetic moment is inverted from the anti-parallel state to the parallel state.

On the other hand, when the directions of the magnetic moments are parallel to each other in the magnetization fixed layer 103 and the storage layer 105, if an electric current flows through the direction to transfer electrons from the storage layer 105 to the magnetization fixed layer 103, then torque is applied to the magnetization fixed layer 103 and the storage layer 105 when electrons spin-inverted after they were reflected on the magnetization fixed layer 103 enter the storage layer 103 with the result that the magnetic moments can be inverted from the parallel state into the anti-parallel state.

However, an amount of an electric current required to invert the magnetic moments from the parallel state to the anti-parallel state is increased more as compared with that required when the magnetic moments are inverted from the anti-parallel state to the parallel state.

As described above, information ("0" information and "1" information) is recorded on the storage layer 105 with application of electric currents higher than a certain threshold value corresponding to the respective polarities in the direction from the magnetization fixed layer 103 to the storage layer 105 and vice versa.

Also, information can be read out from the storage layer 105 by using a resistance change dependent on a relative angle between the magnetic moments of the storage layer 105 and the magnetization fixed layer (reference layer) 103, that is, a so-called magnetoresistive effect in which the minimum resistance is obtained when the magnetic moments are parallel to each other and in which the maximum resistance is obtained when the magnetic moments are anti-parallel to each other.

Specifically, when a substantially constant voltage is applied to the storage element 110 and a magnitude of an electric current flowing at that time is detected, information can be read out from the storage layer 105.

In the following description, a relationship between the resistance state of the storage element 110 and information will be prescribed in such a manner that a low resistance state is prescribed as "1" information, a high resistance state being prescribed as "0" information, respectively.

Also, an electric current to transfer electrons from the capping layer 106 shown in FIG. 1 to the underlayer 101, that is, from the upper layer to the lower layer is prescribed as a positive polarity electric current. At that time, when a positive polarity electric current flows through the storage element 110, electrons are transferred from the capping layer 106 to the underlayer 101, that is, from the storage layer 1–5 to the magnetization fixed layer 103 so that the direction of the magnetization M111 of the magnetization fixed layer 103 and the direction of the magnetization M112 of the storage layer 105 are placed in the anti-parallel state, thereby resulting in the storage element 110 being set to the high resistance state as mentioned hereinbefore.

Accordingly, an electric current to write "1" information (low resistance state) becomes negative in polarity and an electric current to write "0" information (high resistance state) becomes positive in polarity.

The polarity of electric current to write information, that is, whether a negative polarity write electric current –Iw corresponds to writing of "1" information or writing of "0" information is prescribed based on the arrangement of the multilayer film of the storage element and the like.

Figure 2:
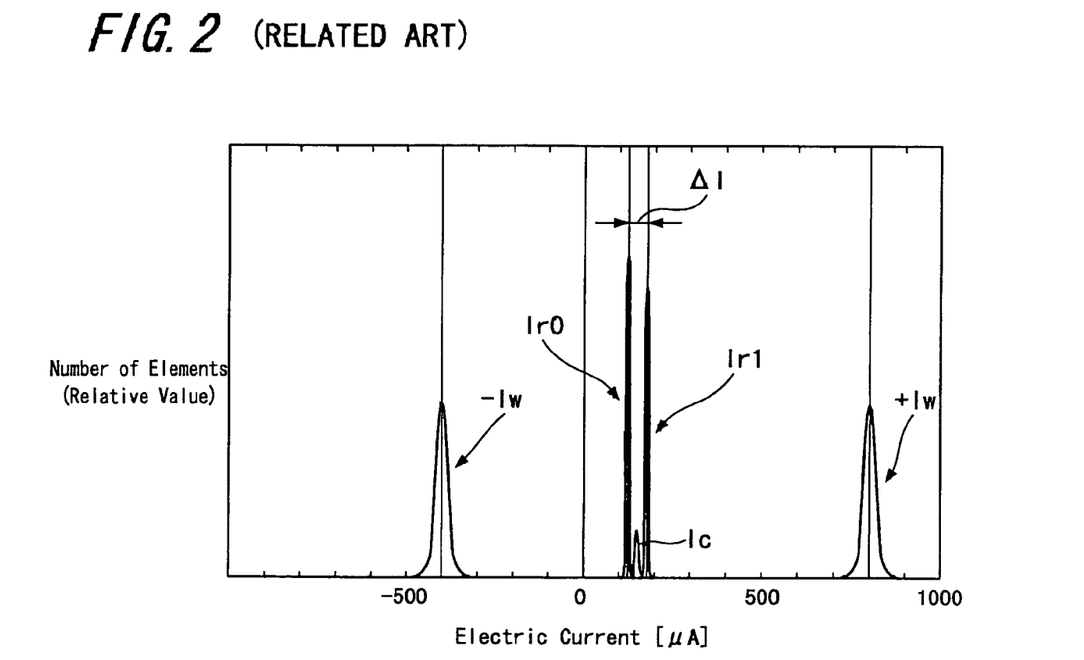
FIG. 2 is a schematic diagram showing a mutual relationship between operation electric currents of write operations and read operations in the storage element for recording information by using spin transfer.

FIG. 2 is a schematic diagram showing a mutual relationship between operation electric currents for write operation and read operation in a storage element like the storage element 110, shown in FIG. 1, for recording information by using spin transfer. In FIG. 2, a horizontal axis represents an electric current and a vertical axis represents the number of elements through which an electric current of a certain magnitude flows upon predetermined operation.

FIG. 2 shows distributions and average values of electric currents +Iw and –Iw which are required to write "1" information or "0" information, respectively.

Further, in FIG. 2, Ir0 and Ir1 denote distributions and average values of electric currents required upon reading. Ir0 with a small electric current amount corresponds to the reading of the high resistance state ("0" information) and Ir1 with a large electric current amount corresponds to the reading of the low resistance state ("1" information). In FIG. 2, reference numeral Ic denotes an electric current which flows through a read reference cell (cell to generate a reference electric current for use with an operational amplifier for comparison). Reference numeral ΔI denotes a difference current corresponding to the change of resistance upon reading.

As is clear from FIG. 2, for example, it is customary that absolute values of the electric currents –Iw and +Iw required to write "1" information and "0" information are not equal to each other. As shown in FIG. 2, the absolute value of the positive polarity electric current +Iw is larger than that of the negative polarity electric current –Iw.

Asymmetric property of the write electric currents –Iw and +Iw of both polarities is generated not only based on the recording principle of the above-mentioned spin transfer but also influences of the external magnetic field.

Figure 3:
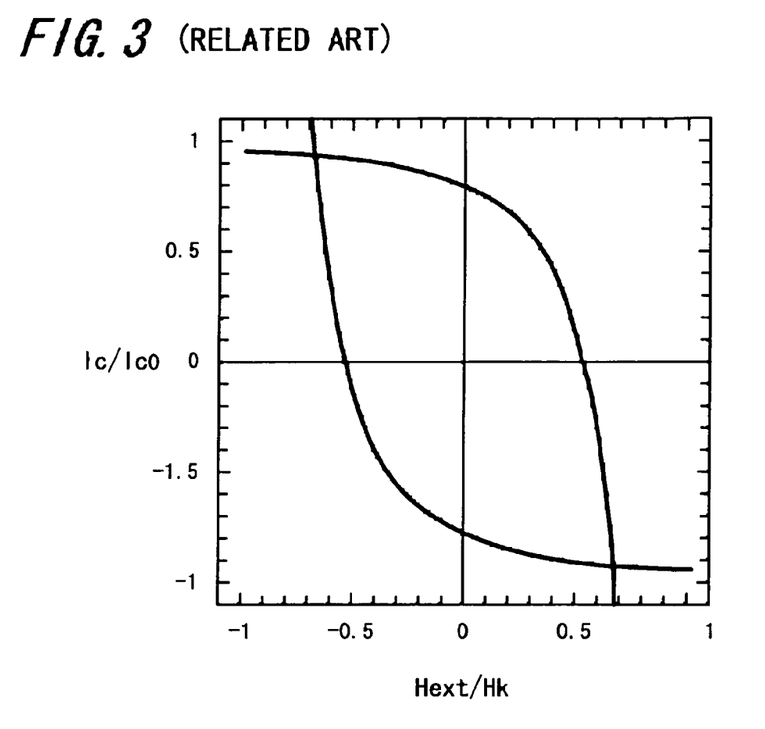
FIG. 3 is a diagram schematically showing influences exerted upon a write electric current from an external magnetic field.

FIG. 3 is a diagram showing influences exerted upon the write electric currents by the external magnetic field. In FIG. 3, a horizontal axis represents an external magnetic field $H_{ext}$ normalized by a magnetic anisotropy $H_k$ of the storage layer and a vertical axis represents a write electric current $I_c$ similarly normalized.

A study of FIG. 3 reveals that, if the absolute values of the write electric currents of both positive and negative polarities are equal to each other without application of the external magnetic field ($H_{ext}$=0), then when the external magnetic field $H_{ext}$ is applied, the absolute values of the write electric currents of both positive and negative polarities become different from each other.

Then, if the memory is constructed by using the magnetization inversion based on the above-mentioned spin transfer, when respective information ("0" information and "1" information) are recorded on the storage layer, polarities of electric currents applied to the storage element should be changed as in the positive polarity +Iw and the negative polarity –Iw, respectively.

For this reason, there is employed a method in which transfer gates composed of P type and N type MOS transistors are used as memory cell selection switches for the storage element in each memory cell.

However, even when any method is employed, it has been difficult to make the absolute values of maximum saturation electric currents, which can be applied with respective polarities in both directions, become equal to each other.

As a result, in order to guarantee a saturation electric current of one polarity sufficient to record information, the size of the transistor is increased unavoidably and hence this hinders the memory from becoming high in density.

SUMMARY OF THE INVENTION

In view of the aforesaid aspect, the present invention intends to provide a memory in which a size of each memory cell including the selection transistor can be decreased to the minimum by suppressing influences of asymmetric property of a write electric current and in which a memory can integrate the memory cells at a high density.

According to an aspect of the present invention, there is provided a memory which is composed of a storage layer for storing therein information based on the magnetization state of a magnetic material, a magnetization fixed layer provided on the storage layer through an intermediate layer, a storage element for applying an electric current in the laminating layer direction to change the direction of magnetization of the storage layer thereby to record information on the storage layer and a memory cell including a selection transistor, wherein a polarity which requires a large amount of electric current to record information and a polarity by which a large amount of saturation electric current can be supplied to the selection transistor are made coincident with each other.

According to the above-mentioned present invention, a polarity of an electric current requiring a large amount of electric current to record information on the storage element and a polarity of an electric current by which a larger amount of saturation electric current can be supplied to the selection transistor are the same so that according to the electric current polarity requiring a larger amount of electric current to record information on the storage element, a saturation electric current of the selection transistor is increased. Therefore, without increasing the gate width of the selection transistor of the memory cell, it is possible to supply an electric current amount required to record information on the storage element.

As a consequence, it becomes possible to reduce the size of the memory cell by decreasing the gate width of the selection transistor of the memory cell.

Accordingly, without considerably changing materials of other portions such as the memory element and the circuit arrangement, it becomes possible to reduce the size of the selection transistor to the minimum.

According to the above-mentioned present invention, without considerably changing the materials, the circuit arrangement and the like, it becomes possible to reduce the size of the selection transistor to the minimum and hence it becomes possible to integrate memory cells at high density.

Depending on the above, an increase of memory storing capacity and miniaturization of the memory can be attempted.

DESCRIPTION OF THE PREFERRED EMBODIMENTS

First, prior to the description of the preferred embodiments of the present invention, the present invention will be outlined.

Also in the following description, as mentioned hereinbefore, the low resistance state will be prescribed as "1" information and the high resistance state will be prescribed as "0" information, respectively. Also, an electric current by which electrons can be moved from the upper layer of the storage element to the lower layer will be prescribed as a positive polarity electric current.

Figure 4:
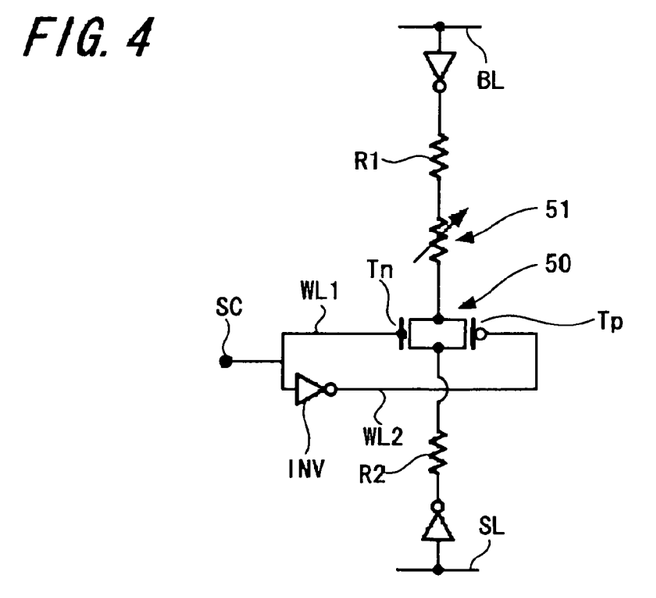
FIG. 4 is a circuit diagram showing an arrangement of a transfer gate.

FIG. 4 is a circuit diagram showing the case in which a transfer gate is used as a selection transistor of a storage element of each memory cell constructing a memory.

A transfer gate 50 shown in FIG. 4 is composed of two transistors of an NMOS transistor Tn and a PMOS transistor Tp of which sources and drains are both connected commonly. Also, the gate of the NMOS transistor Tn is connected to a word line WL1 on the upper side of FIG. 4 and the gate of the PMOS transistor Tp is connected to a word line WL2 on the lower side of FIG. 4.

A control signal SC is directly inputted to the word line WL1 on the upper side of FIG. 4.

An inverter INV is connected to the word line WL2 on the lower side of FIG. 4 and the control signal SC is inputted to the inverter INV. Thus, an inverted signal of the control signal SC is inputted to the word line WL2.

Then, the sources, for example, of the two transistors Tn and Tp are connected to one end of a storage element 51 and the other end of the storage element 51 is connected to a first wiring (bit line BL). Also, the drains, for example, of the two transistors Tn and Tp are connected to a second wiring (sense line SL). In FIG. 4, reference numerals R1 and R2 denote wiring resistors, respectively.

Then, when the control signal SC is inputted to the transfer gate 50, the word line WL1 goes to high level and the word line WL2 goes to low level, whereby the NMOS transistor Tn and the PMOS transistor Tp can be both turned ON. As a result, an electric current can flow through the source-drain of the NMOS transistor TN and the PMOS transistor Tp. Then, since the direction in which the electric current can easily flow through the NMOS transistor Tn and the direction in which the electric current can easily flow through the PMOS transistor Tp are opposite to each other and the sources and drains of these transistors Tn and Tp are connected together so that these transistors Tn and Tp are connected in parallel to each other, it becomes possible to apply electric currents of both polarities to the storage element 51.

When on the other hand the control signal SC is not inputted to the transfer gate 50, the NMOS transistor Tn and the PMOS transistor Tp are both turned OFF and no electric current flows through the source-drain so that no electric current is applied to the storage element 51. Since no electric current is applied to the storage element 51, in this state, a polarity of a potential difference between the bit line BL and the sense line SL can be changed. Thus, when the NMOS transistor Tn and the PMOS transistor Tp are both turned ON, it becomes possible to invert the polarity of the electric current flowing through the storage element 51.

Then, in the transfer gate 50 shown in FIG. 4, dependence of the saturation electric currents of the transistors Tn and Tp on the sizes of the transistors Tn and Tp was examined.

The NMOS transistor Tn and the PMOS transistor Tp were respectively formed, the transfer gate 50 was constructed by connecting the sources and drains of these two transistors Tn and Tp with wirings and the storage element 51 and the amplifier were connected to this transfer gate 50, thereby manufacturing the circuit shown in FIG. 4. Then, the gate lengths of the two transistors Tn and Tp were selected to be 0.18 μm and gate widths of the two transistors Tn and Tp were being changed, thereby manufacturing respective samples. To be more concrete, the gate width of the PMOS transistor Tp was selected to be 0.5 μm, 1 μm, 1.5 μm and 2 μm, respectively, and the gate width of the NMOS transistor Tn was selected to be 0.5 μm, 1 μm and 1.5 μm, respectively, thereby resulting in samples of 12 kinds in total being manufactured.

Figure 5:
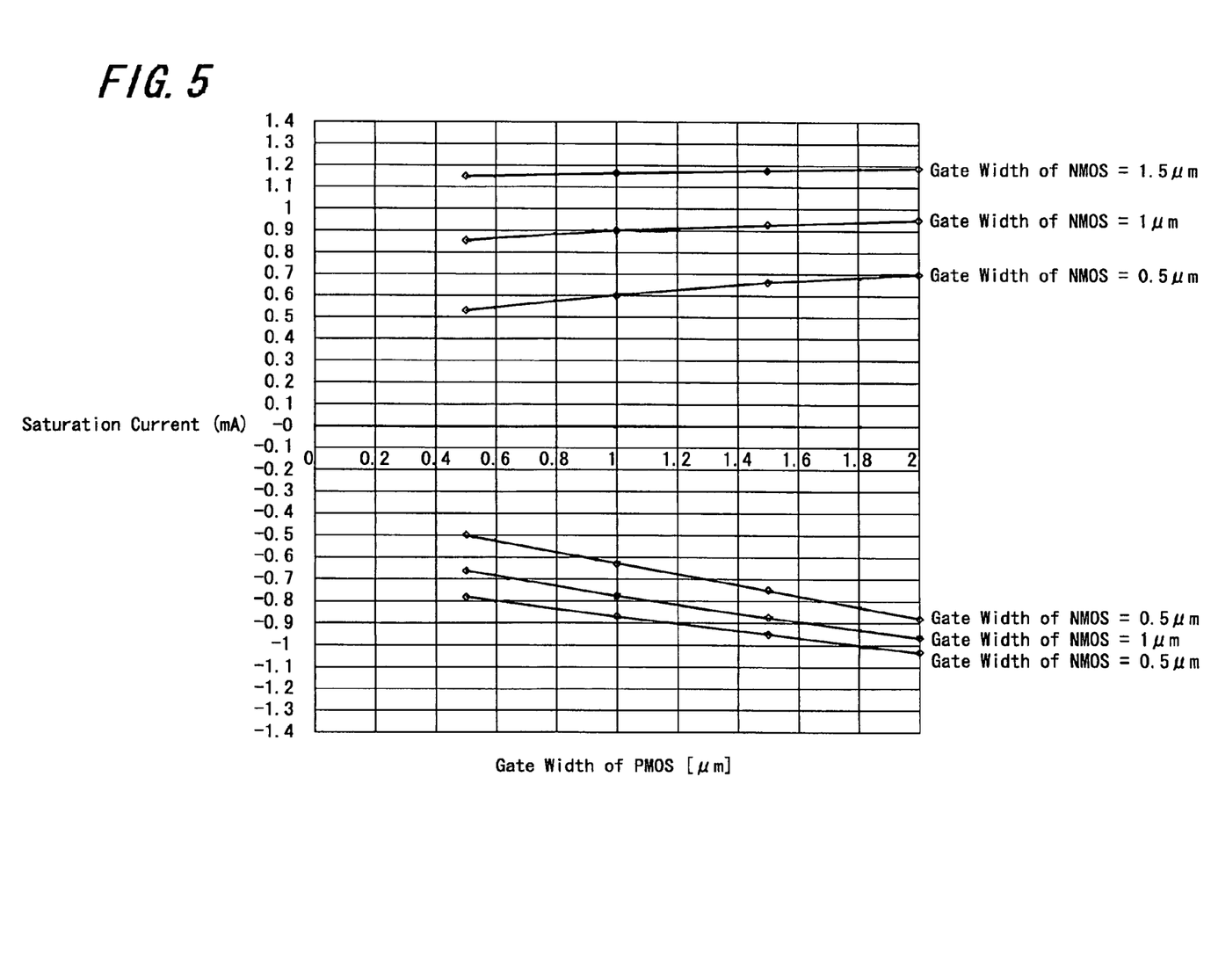
FIG. 5 is a diagram showing measured results obtained when saturation electric current amounts in respective electric current polarities were measured while the gate width of the transistor in the circuit shown in FIG. 4 was being changed.

Then, with respect to the respective samples, magnitude of a voltage Vdd was selected to be 2.5V, the voltage Vdd was applied to one of the bit line BL and the sense line SL, the ground potential (0V) was applied to the other and saturation electric current amounts in the respective voltage polarities, that is, respective electric current polarities were measured. FIG. 5 shows measured results.

In FIG. 5, the upper side (+) shows the case in which the voltage Vdd was applied to the bit line BL and the ground potential was applied to the sense line SL. Also, the lower side (−) shows the case in which the ground potential was applied to the bit line BL and the voltage Vdd was applied to the sense line SL.

The vertical axis in FIG. 5 represents the saturation electric current (mA) and the horizontal axis represents the gate width (μm) of the PMOS transistor Tp.

As shown in FIG. 5, it is clear that the absolute values of the saturation electric currents are different in both of + and − polarities excepting specific combinations of the gate width (PMOS width) of the PMOS transistor Tp and the gate width (NMOS width) of the NMOS transistor Tn.

That is, maximum electric current values which can pass the two transistors Tn and Tp of the transfer gate 50 are asymmetric.

Also, a detailed study of FIG. 5 reveals the following facts.

With respect to electric currents of + and − polarities, the absolute values of the saturation electric currents are increased as the gate width (PMOS width) of the PMOS transistor Tp becomes wider and the gate width (NMOS width) of the NMOS transistor Tn becomes wider.

However, with respect to the electric current of + polarity, influence exerted by the change of the gate width (NMOS width) of the NMOS transistor Tn is large. Also, with respect to the electric current of − polarity, influence exerted by the change of the gate width (PMOS width) of the PMOS transistor Tp is large.

In the range of FIG. 5, a sample in which the NMOS width is selected to be 0.5 μm and the PMOS width is selected to be greater than 1 μm and a sample in which the NMOS width is selected to be 1 μm and the PMOS width is selected to be 2 μm have large absolute values of saturation electric currents of − polarity and other samples have large absolute values of saturation electric currents of − polarity.

Then, recording electric currents of both + and − polarities in the storage element, shown in FIG. 2, capable of storing therein information by using the spin transfer and saturation electric currents of the selection transistor shown in FIG. 5 are both asymmetric in both of + and − polarities. It has been customary that these polarities are arbitrarily combined in use.

According to the present invention, asymmetric property of recording electric currents of both + and − polarities in the storage element, shown in FIG. 2, capable of storing therein information by using spin transfer and asymmetric property of both + and − polarities of saturation electric current (maximum electric current) in the selection transistor shown in FIG. 5 are made coincident with each other, whereby the electric current polarity requiring an electric current of a larger electric current amount to record information on the storage element and the electric current polarity by which a saturation electric current of a larger electric current amount can flow through the selection transistor are made the same electric current polarity.

Specifically, the polarity (+Iw) of the recording electric current of which absolute value is larger in FIG. 2 is made coincident with the polarity of which saturation electric current is larger in FIG. 5 (for example, + side when the NMOS width is selected to be 1 μm and the PMOS width is selected to be 0.5 μm).

As a result, it becomes possible to reduce the size of the memory cell by decreasing the gate width of the selection transistor of the memory cell.

Subsequently, specific embodiments of the present invention will be described below.

Figure 6:
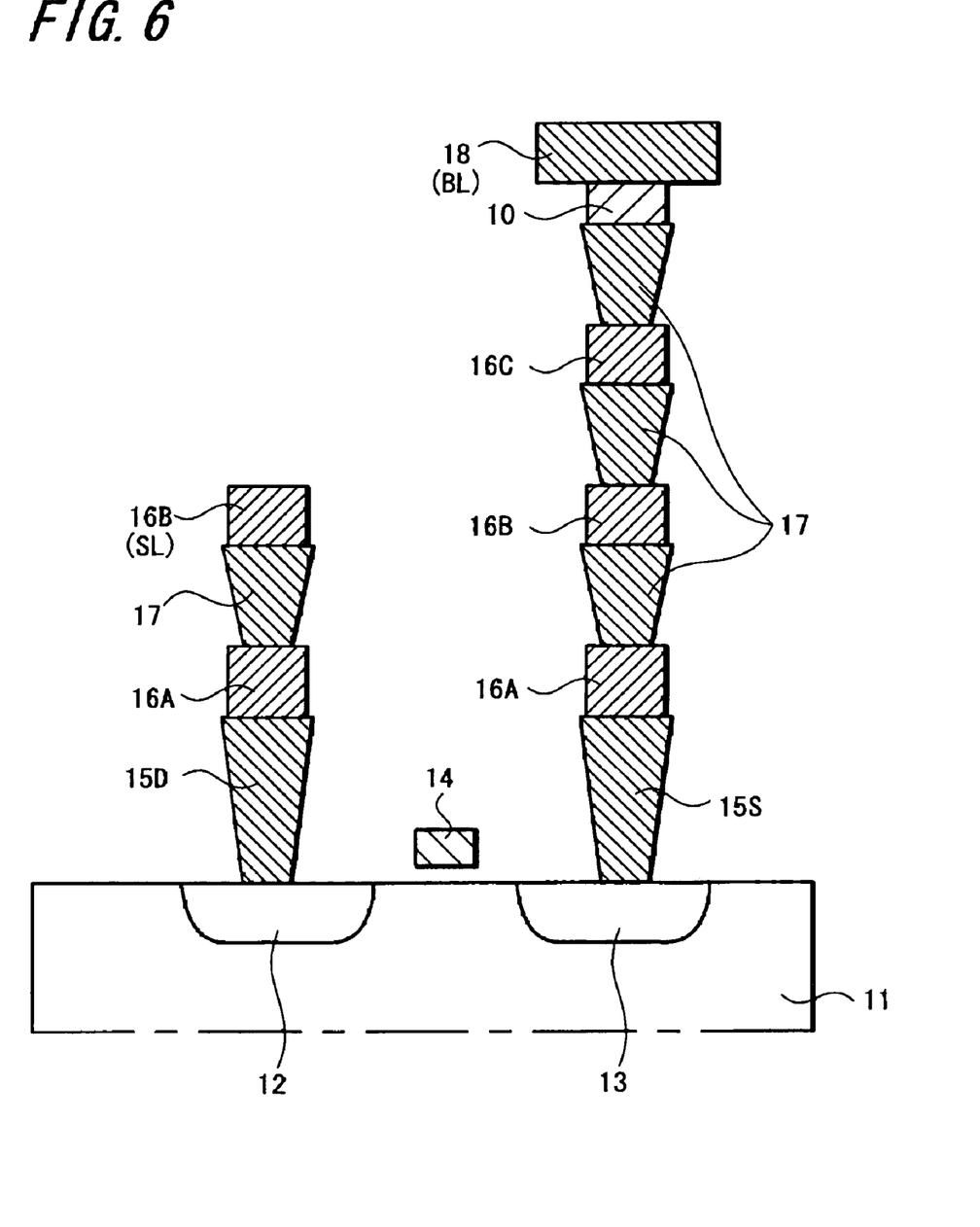
FIG. 6 is a schematic diagram (cross-sectional view of one memory cell) showing an arrangement of a memory according to an embodiment of the present invention.

FIG. 6 is a schematic diagram (cross-sectional view) showing an arrangement of a memory according to an embodiment of the present invention. Specifically, FIG. 6 is a cross-sectional view showing one memory cell constructing a memory (storage apparatus).

In this memory, the memory cell is constructed by a storage element 10 which is capable of storing therein information based on the magnetization state.

This storage element 10 includes a storage layer made of a ferromagnetic layer of which magnetization direction is changed based on spin transfer.

As shown in FIG. 6, a drain region 12, a source region 13 and a gate electrode 14 constructing a selection transistor to select each memory cell are respectively formed on a semiconductor substrate 11 such as a silicon substrate.

Of these elements, the gate electrode 14 is connected to a word line WL (see FIG. 2) which is located the cross-section different from that of FIG. 6. The drain region 12 is connected through a contact layer 15D, an interconnection layer 16A of a first layer and a buried metal layer 17 to a sense line SL made of an interconnection layer 16B of a second layer. The source region 13 is connected through a contact layer 15S, the interconnection layer 16A of the first layer, the interconnection layer 16B of the second layer, an interconnection layer 16C of a third layer and a buried metal layer 17 among the interconnection layers 16A, 16B and 16C to the storage element 10.

Then, the storage element 10 is connected to a bit line BL composed of an interconnection layer 18 of a fourth layer.

When the drain region 12 is formed common to two selection transistors, for example, it becomes possible to make the sense line SL become common to two memory cells.

Figure 7A:
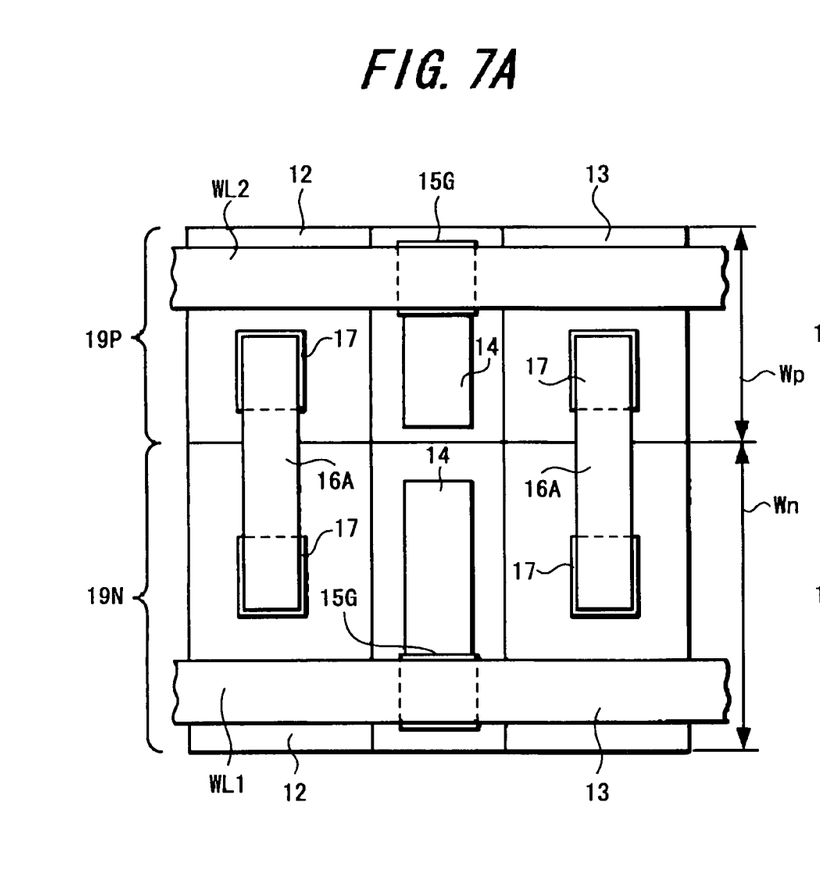
FIG. 7A is a plan view showing the layer portions lower than the interconnection layer of the first layer of the memory cell shown in FIG. 6.
Figure 7B:
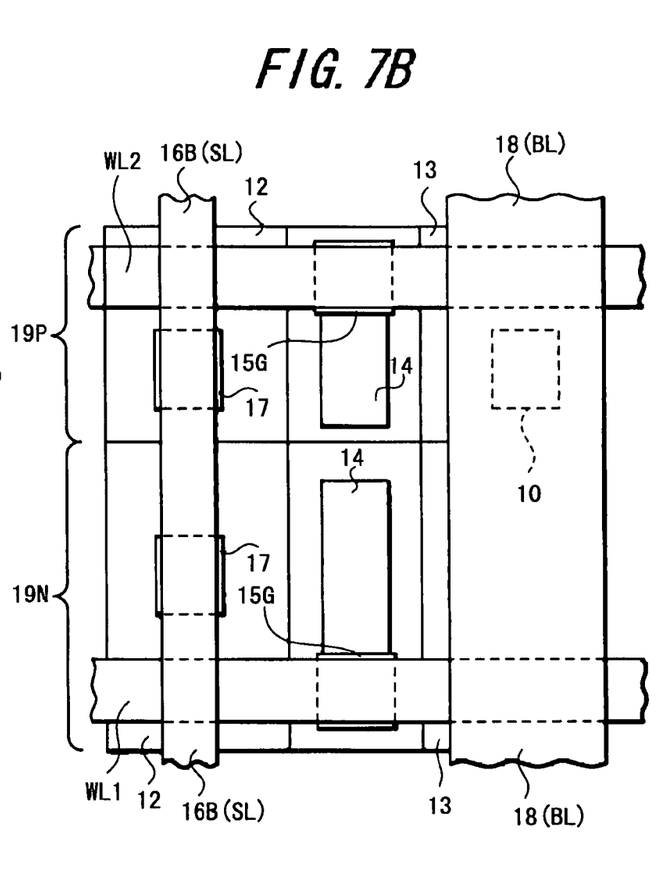
FIG. 7B is a top view of the memory cell shown in FIG. 6.

FIG. 7A is a plan view showing the lower layer portion lower than the interconnection layer 16A of the first layer of one memory cell of the memory according to the embodiment of the present invention and FIG. 7B is a top view thereof.

As shown in FIGS. 7A and 7B, the selection transistor is constructed in such a manner that sources and drains of an NMOS transistor 19N and a PMOS transistor 19P are electrically connected together through the interconnection layer 16A of the first layer.

Consequently, these NMOS transistor 19N and PMOS transistor 19P constitute a so-called transfer gate.

Then, by this transfer gate, it is possible to switch one memory cell in such a manner that an electric current can flow through the storage element 10 and that an electric current can be inhibited from flowing through the storage element 10.

The gate electrode 14 of the NMOS transistor 19N is connected through a contact layer 15G to a word line WL1. The gate electrode 14 of the PMOS transistor 19P is connected through the contact layer 15G to a word line WL2 composed of the interconnection layer 16A of the first layer. In response to ON and OFF of the electric current applied to the storage element 10, the control signal SC is supplied to one of the word line WL1 of the NMOS transistor 19N side and the word line WL2 of the PMOS transistor 19P side and the control signal, which results from inverting the same control signal SC by the inverter INV, is supplied to the other similarly as shown in FIG. 4.

When the positive or negative potential difference is applied to the bit line BL and the sense line SL and the high level voltage is applied to the word line WL as the control signal SC so that the transfer gate is turned ON, it is possible to apply the electric current to any of the lamination layer directions of the storage element 10.

Figure 8:
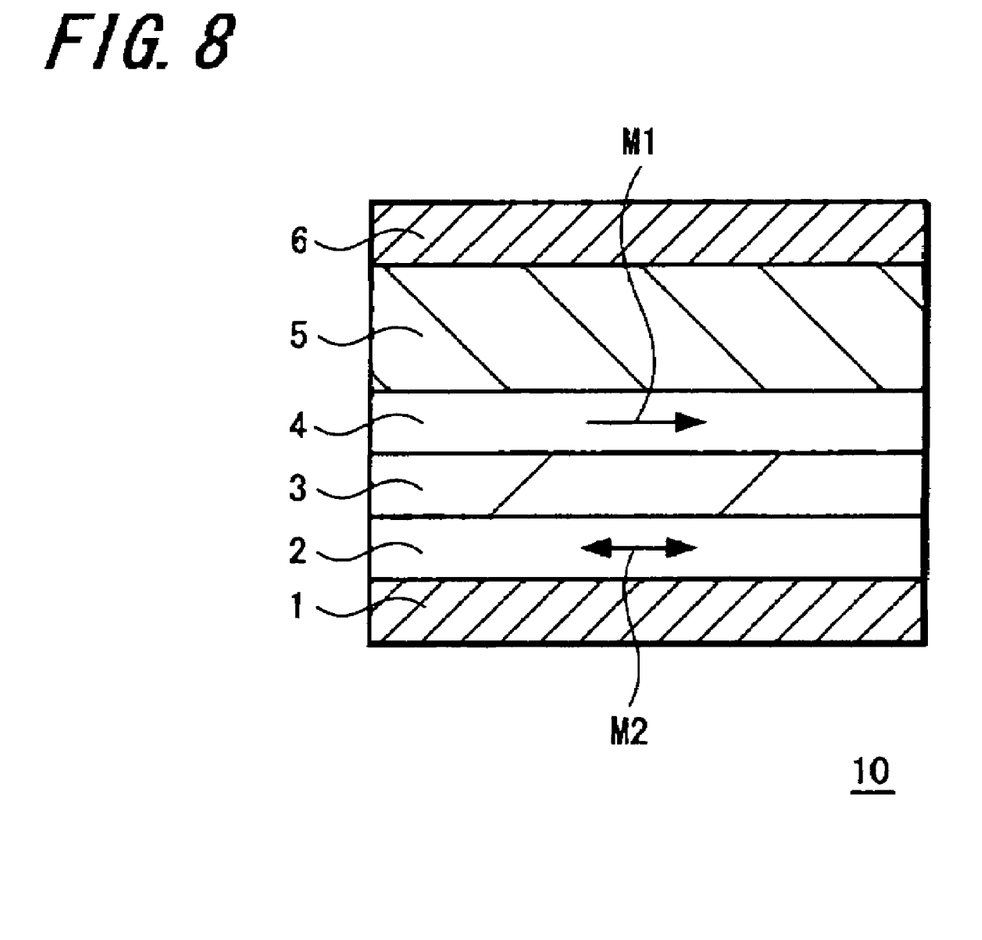
FIG. 8 is a schematic diagram (cross-sectional view) showing an arrangement of the storage element shown in FIG. 6.

FIG. 8 is a schematic diagram (cross-sectional view) showing an arrangement of the storage element 10 constructing the memory according to the embodiment of the present invention.

As shown in FIG. 8, this storage element 10 is composed of an underlayer 1, a storage layer 2, a non-magnetic layer 3, a magnetization fixed layer 4, an antiferromagnetic layer 5 and a capping layer 6, laminated with each other, in that order, from the lower layer.

The antiferromagnetic layer 5 is provided on the magnetization fixed layer 4 and the direction of a magnetization M1 of the magnetization fixed layer 4 is fixed by this antiferromagnetic layer 5. In FIG. 8, the direction of the magnetization M1 of the magnetization fixed layer 4 is fixed to the right-hand side.

The storage layer 2 is adapted to store therein information based on the magnetization state, that is, the direction of a magnetization M2. The storage layer 2 is able to store therein information based on whether the direction of the magnetization M2 is the right-hand side or the left-hand side.

Also, since the non-magnetic layer 3 is provided between the storage layer 2 and the magnetization fixed layer 4, the storage layer 2 and the magnetization fixed layer 4 constitute the GMR element or the MTJ element. As a result, it is possible to detect the direction of the magnetization M2 of the storage layer 2 by using the magnetoresistive effect.

Specifically, when the direction of the magnetization M2 of the storage layer 2 is parallel to (in the right-hand side of) the direction (right-hand side) of the magnetization M1 of the magnetization fixed layer 4, electric resistance is decreased and when they are placed in the anti-parallel state (left-hand side), electric resistance is increased. Hence, it is possible to detect the direction of the magnetization M2 of the storage layer 2.

Materials of the storage layer 2 and the magnetization fixed layer 4 are not limited in particular, and alloy materials made of one kind or more than two kinds of iron, nickel and cobalt such as CoFe and NiFe and oxide containing these elements can be used. Further, these alloy materials may contain transition metal elements such as Nb and Zr and light metal such as B as in CoFeB and the like.

As the materials of the antiferromagnetic material 5, there can be used alloys of metal elements such as iron, nickel, platinum, iridium and rhodium and manganese, oxides such as cobalt and nickel and so on.

The non-magnetic layer 3 is composed of a non-magnetic conductive layer or an insulating layer such as a tunnel barrier layer. As the non-magnetic conductive layer, there can be used ruthenium, copper, chromium, gold and silver. As the tunnel barrier layer, there can be used oxides such as aluminum oxide, magnesium oxide, tantalum oxide, hafnium oxide and zirconium oxide, nitrides such as aluminum nitride or insulating materials containing more than one kind of these compounds.

The storage element may be constructed in such a manner that the laminating order of the respective layer may become opposite to that of the storage element 10 shown in FIG. 8.

In the memory according to this embodiment, the + electric current characteristic shown in FIG. 5, in particular, is made corresponding to the same electric current characteristic as the + electric current characteristic in FIG. 2.

As described above, when the electric current polarities are made corresponding to each other, the electric current polarity (+ electric current polarity shown in FIG. 2) which requires an electric current of a larger electric current amount to record information of the storage element and the electric current polarity (+ electric current polarity shown in FIG. 5) by which a saturation electric current of a larger electric current amount can flow through the selection transistor are made coincident with each other. Thus, as mentioned hereinbefore, it becomes possible to reduce the size of the memory cell by reducing the gate width of the selection transistor of the memory cell.

Consequently, the gate width (NMOS width) of the NMOS transistor 19N constructing the transfer gate, for example, can be set to 1 μm and the gate width (PMOS width) of the PMOS transistor 19P can be set to 0.5 μm.

Then, with the above-mentioned setting, it is possible to generate a recording electric current of a sufficiently large electric current amount.

In the memory according to this embodiment, in order that the + electric current polarity shown in FIG. 5 may correspond to the same electric current polarity as the + electric current polarity shown in FIG. 2, the memory cell including the storage element 10 and the selection transistors 19N and 19P may be constructed as follows.

In the storage element shown in FIG. 8, since the storage layer 2 is located under the magnetization fixed layer 4, if electrons are applied to the storage element 10 from the lower layer to the upper layer (from the storage layer 2 to the magnetization fixed layer 4), that is, an electric current is applied to the storage element 10 from the upper layer to the lower layer, then the directions of the magnetizations M1 and M2 of the magnetization fixed layer 4 and the storage layer 2 are made anti-parallel to each other and hence a large electric current is required. Accordingly, the electric current flowing from the upper layer to the lower layer becomes +Iw shown in FIG. 2.

Also, the + electric current polarity shown in FIG. 5 shows the case in which electrons are applied from the sense line SL to the bit line BL, that is, an electric current is applied from the bit line BL to the sense line SL with application of high level potential of positive polarity to the bit line BL of the storage element 10 side, for example, and with application of low level potential of positive polarity to the sense line SL of the transistor side. At that time, since electrons are moved from the transistor of the lower layer to the storage element 10 of the upper layer, electrons are also moved within the storage element 10 from the lower layer to the upper layer.

Accordingly, in the memory cell having the arrangement shown in FIG. 6, if the layer arrangement of the storage element 10 is made in such a manner that the storage layer 2 is located under the magnetization fixed layer 4 as shown in FIG. 8, then the + electric current polarity shown in FIG. 5 and the + electric current polarity shown in FIG. 2 are made corresponding to the same electric current polarity so that a saturation electric current of the electric current polarity which requires an electric current of a larger electric current amount to record information is increased.

When the layer arrangement of the storage element is made in such a manner that the storage layer is located above the magnetization fixed layer, then potentials applied to the bit line BL and the sense line SL are selected in such a fashion that an electric current may flow from the transistor of the lower layer to the storage element of the upper layer, that is, electrons may be moved from the storage element of the upper layer to the transistor of the lower layer, then similar effects can be achieved.

Figure 9A:
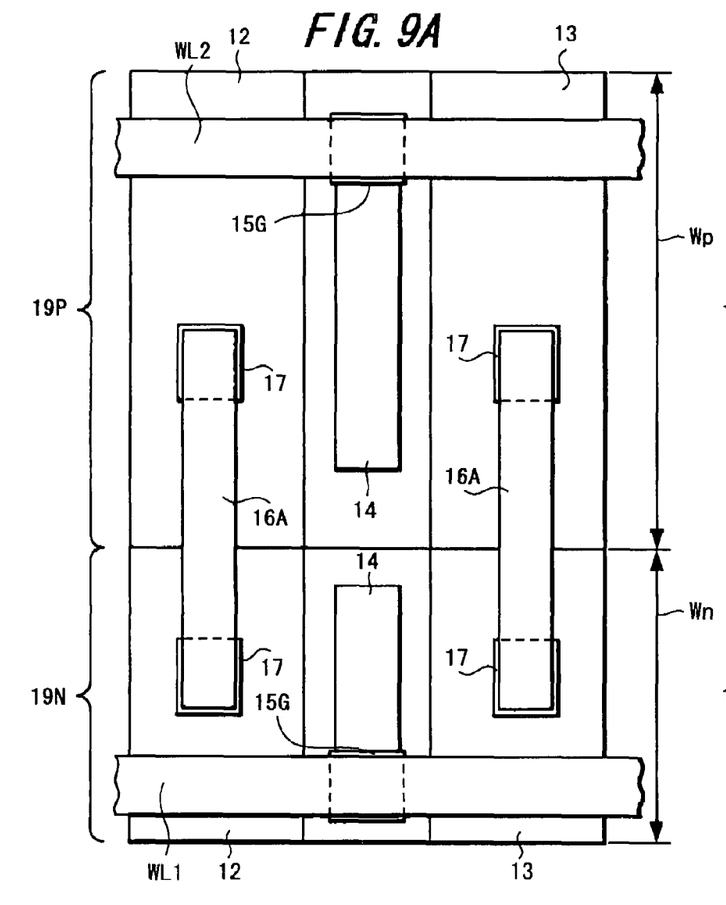
FIG. 9A is a plan view showing the layer portions lower than the interconnection layer of the first layer of a memory cell of a memory device according to a comparative example.
Figure 9B:
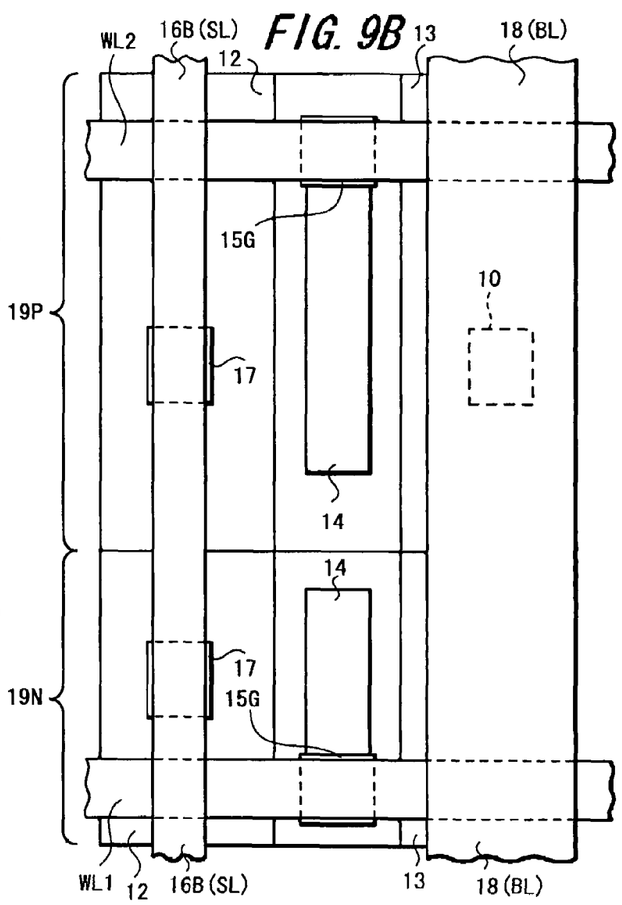
FIG. 9B is a top view of the memory cell of the memory device according to the comparative example.

FIGS. 9A and 9B show an arrangement of a memory device serving as a comparative example in which the + electric current polarity shown in FIG. 5 is made corresponding to the same electric current polarity as the − electric current polarity shown in FIG. 2. FIG. 9A is a plan view showing the lower layer portion lower than the interconnection layer of the first layer of one memory cell of the memory device of the comparative example and FIG. 9B is a top view thereof.

As shown in FIGS. 9A and 9B, in the device of this comparative example, in order to maintain a sufficient recording electric current, the gate width (NMOS width) of the NMOS transistor 19N is set to be 1 μm and the gate width (PMOS width) of the PMOS transistor 19P, each of which constructs the transfer gate, for example, is set to be 1.5 μm, respectively.

Having compared FIGS. 7A, 7B with FIGS. 9A, 9B, it is to be understood that the memory of this embodiment can be reduced in size of memory cell and it can be increased in storage capacity with the same chip size as compared with the memory device of the comparative example.

According to the above-mentioned memory of this embodiment, when the + electric current polarity shown in FIG. 5 is made corresponding to the same electric current polarity as the + electric current polarity shown in FIG. 2, the electric current polarity which requires an electric current of a larger electric current amount to record information on the storage element 10 and the electric current polarity by which a saturation electric current of a larger electric current amount can flow through the selection transistor can be made coincident with each other. Therefore, the selection transistor of the memory cell, in particular, the gate width (PMOS width) of the PMOS transistor 19P can be reduced and hence it is possible to reduce the size of the memory cell.

As a result, without considerably changing the materials and the circuit arrangements of other portions of the memory cell such as the storage element 10, it becomes possible to reduce the sizes of the selection transistors 19N and 19P to the minimum.

Accordingly, it becomes possible to integrate the memory cells at a high density and the storage capacity of the memory can be increased and the memory can be miniaturized.

The layer arrangements of the storage elements according to the above-mentioned embodiments can be varied within their essential roles.

For example, the magnetization fixed layer is not limited to the laminating layer of the antiferromagnetic layer but it can be made of a ferromagnetic material which has sufficiently large coercive force alone.

Also, the magnetic material layer constructing the storage layer and the magnetization fixed layer is not limited to the magnetic layer of the single layer and it may have a laminating layer ferri structure in which more than two layers having different compositions are directly laminated with each other or in which more than two layers of magnetic material layers are laminated with each other through a non-magnetic layer.

Further, the above-mentioned operation principle of the present invention is not limited to the memory using the spin transfer and it may be generally applied to a memory capable of recording information ("0" information and "1" information) based on a bipolar electric current and which is able to read information by detecting resistance change with an electric current of an arbitrary direction.

According to the above-mentioned present invention, without considerably changing the materials, the circuit arrangement and the like, it becomes possible to reduce the size of the selection transistor to the minimum and hence it becomes possible to integrate memory cells at high density.

It should be understood by those skilled in the art that various modifications, combinations, sub-combinations and alterations may occur depending on design requirements and other factors insofar as they are within the scope of the appended claims or the equivalents thereof.

What is claimed is:

1. A memory comprising:
    a control signal line for receiving a control signal having a first polarity during operation of the memory;
    a first word line connected to the control signal line;
    an inverter connected to the control signal line;
    a second word line connected to the inverter;
    a transfer gate connected to the first word line and to the second word line so the transfer gate receives the control signal by way of the control signal line and the first word line and the transfer gate receives an inverted control signal having a second polarity opposite said first polarity by way of the control signal line, the inverter, and the second word line during operation of the memory; and
    a storage element connected to the transfer gate including:
        a storage layer including a magnetic material storing information based on a magnetization state of the magnetic material;

an intermediate layer positioned adjacent said storage layer; and a magnetization fixed layer provided on said storage layer through the intermediate layer;

wherein the control signal and the inverted control signal are joined in the transfer gate to form a combined signal having both the first polarity and the second polarity and the combined signal is applied to the storage element during operation of the memory.

2. A memory as set forth in claim 1 wherein the transfer gate includes a first transistor connected to the first word line and a second transistor connected to the second word line, each transistor including a source connected to the storage element.

3. A memory as set forth in claim 2 wherein the first transistor is a NMOS-type transistor and the second transistor is a PMOS-type transistor.

4. A memory as set forth in claim 3 further including a bit line connected to the storage element and a first resistor connected to the storage element and the bit line.

5. A memory as set forth in claim 2 wherein each transistor further includes a drain and the memory further includes a sense line connected to the drain of the first transistor and the drain of the second transistor.

6. A memory as set forth in claim 5 further including a second resistor connected to the sense line and to the drain of the first transistor and the drain of the second transistor.

7. A memory as set forth in claim 5 further including a bit line connected to the storage element.

8. A memory as set forth in claim 7 further including a second resistor connected to the sense line and to the drain of the first transistor and the drain of the second transistor.

* * * * *